(12) United States Patent
Akamatsu et al.

(10) Patent No.: US 7,743,966 B2
(45) Date of Patent: Jun. 29, 2010

(54) SOLDERING FLUX AND METHOD FOR BONDING SEMICONDUCTOR ELEMENT

(75) Inventors: Toshiya Akamatsu, Kawasaki (JP); Seiki Sakuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 647 days.

(21) Appl. No.: 11/475,001

(22) Filed: Jun. 27, 2006

(65) Prior Publication Data
US 2007/0221710 A1  Sep. 27, 2007

(30) Foreign Application Priority Data
Mar. 27, 2006 (JP) .............................. 2006-085130

(51) Int. Cl.
*B23K 1/20* (2006.01)

(52) U.S. Cl. ..................................... 228/223

(58) Field of Classification Search ................ 228/223, 228/180.1, 180.21, 180.22, 214
See application file for complete search history.

(56) References Cited

U.S. PATENT DOCUMENTS

| 5,489,641 | A | * | 2/1996 | Dershem | 524/439 |
| 5,654,081 | A | * | 8/1997 | Todd | 428/209 |
| 6,500,529 | B1 | * | 12/2002 | McCarthy et al. | 428/209 |
| 6,590,287 | B2 | * | 7/2003 | Ohuchi | 257/738 |
| 7,004,375 | B2 | * | 2/2006 | Shah et al. | 228/215 |
| 2006/0041068 | A1 | * | 2/2006 | Ohno et al. | 525/191 |

FOREIGN PATENT DOCUMENTS

| JP | 09052195 A | * | 2/1997 |
| JP | 10-195487 A | | 7/1998 |
| JP | 2001-7158 A | | 1/2001 |
| JP | 2004-1030 A | | 1/2004 |

* cited by examiner

*Primary Examiner*—Jessica L Ward
*Assistant Examiner*—Steven Ha
(74) *Attorney, Agent, or Firm*—Westerman, Hattori, Daniels & Adrian, LLP

(57) ABSTRACT

The method for bonding a semiconductor element comprises the step of applying to solder bumps 10 of a semiconductor chip 12 a soldering flux 16 which contains a thermosetting resin, a polyhydric alcohol and an organic acid and in which the thermosetting resin remains uncured after reflow-bonding, the step of reflow-bonding the solder bumps 10 to the electrodes 18 of the circuit board 20 with the soldering flux 16 while melting the solder bumps 10, and the step of filling an underfill material 22 between the semiconductor chip 12 and the circuit board 20 with the soldering flux 16 being left, the underfill material 22 containing a thermosetting resin of the same group as the thermosetting resin contained in the soldering flux 16 and at least one of a curing agent and a cure catalyst for curing the thermosetting resins.

4 Claims, 6 Drawing Sheets

SOLDERING FLUX AND METHOD FOR BONDING SEMICONDUCTOR ELEMENT

CROSS-REFERENCE TO RELATED APPLICATIONS

This application is based upon and claims the benefit of priority from the prior Japanese Patent Application No. 2006-085130, filed on Mar. 27, 2006, the entire contents of which are incorporated herein by reference.

BACKGROUND OF THE INVENTION

The present invention relates to a soldering flux and a method for bonding a semiconductor element with the soldering flux, more specifically, a soldering flux and the method for bonding a semiconductor element with the soldering flux which can increase the reliability.

Recently, as electronic devices are increasingly downsized and lightened, the flip-chip method, which mounts a semiconductor chip facedown on a circuit board, is prevalently used as a mounting method for semiconductor chips such as LSI chips, etc.

The conventional flip-chip bonding will be explained with reference to FIGS. 5A-5D and 6A-6C. FIGS. 5A-5D and 6A-6C are sectional views illustrating the conventional flip-chip bonding.

A semiconductor chip 102 with solder bump electrodes, i.e., solder bumps 100 formed on is prepared.

Then, the solder bumps 100 of the semiconductor chip 102 are brought into contact with a flux 106 printed in advance on a flat plate 104 with a squeegee to transfer the flux 106 to the solder bumps 100 (FIG. 5A). The flux 106 is made of, e.g., rosin or others.

Next, a circuit board 110 with electrodes 108 formed on is prepared. Solder bumps 112 are formed on the electrodes 108 of the circuit board 110.

Next, the solder bumps 100 of the semiconductor chip 102 and the electrodes 108 of the circuit board 110 are aligned with each other (FIG. 5B).

Then, the solder bumps 100 of the semiconductor chip 102 and the solder bumps 112 of the circuit board 110 are melted with each other by heating to reflow-bond the solder bumps 100 of the semiconductor chip 102 to the electrodes 108 of the circuit board 110 (FIG. 5C).

Next, the flux 106 remaining between the semiconductor chip and the circuit board is washed off with a solvent 114 (FIG. 5D). The flux 106 is washed off so as to ensure filling and the adhesion strength of an underfill material to be filled between the semiconductor chip 102 and the circuit board 110.

Next, the underfill material 116 of a thermosetting resin is filed between the semiconductor chip 102 and the circuit board 110 (FIGS. 6A and 6B).

Next, the underfill material 116 between the semiconductor chip 102 and the circuit board 110 is cured by heating (FIG. 6C). The underfill material 116 reduces the thermal expansion strain between the semiconductor chip 102 and the circuit board 110 and prohibits the intrusion of water to thereby prevent the corrosion of the solder bumps 100, the electrodes 108, etc.

As semiconductor chips are more integrated, the number of the pins of the semiconductor chips tends to increase. The size of the solder bumps tends to be smaller, and the pitch of the solder bumps tends to be smaller. Recently, it is becoming accordingly difficult to wash off the flux after the solder bonding. The flux residue which has not been washed off and remains between the semiconductor chip and the circuit board causes defects of the filling and decreases of the adhesion strength of the underfill material, which much decrease the reliability of the bonded parts. To perfectly wash off the flux, a long period of time of the washing step and the use of a special washing apparatus are necessary, which causes cost increase.

As a countermeasure to this, as a flux to be used in the flip-chip bonding, a nonwash-type flux, which can be used without washing for removing the flux, is required. The use of a flux of a thermosetting resin instead of rosin is being studied. The nonwash-type flux of a thermosetting resin contains, e.g., epoxy resin as the thermosetting resin, a curing agent for the epoxy resin, an activator having the property of removing oxide film, etc. to activate the bonding surface and cause the solder to exert the bonding strength, and an accelerator for accelerating the cure of the epoxy resin. The nonwash-type flux of the thermosetting resin is being generally used in the surface mount, and is designed to be perfectly cured after the solder bonding so that the flux which has been cured is not melted in reliability tests, etc.

Such nonwash-type flux is used in bonding the solder bumps of the semiconductor chip and the electrodes of the circuit board, whereby the underfill material can be filled without washing the flux.

However, in the flip-chip bonding of a below 100 μm including 100 μm gap between the semiconductor chip and the circuit board, it is difficult to use the nonwash-type flux of a thermosetting resin. The reason is as follows.

The flux which has been cured after the solder bonding form an interface with the underfill material to be filled later. Accordingly, the underfill material has the adhesion strength decreased, and the reliability of the bonded parts is decreased.

The flux which has been cured after the solder bonding further narrows the gap between the semiconductor chip and the circuit board to thereby block the flow of the underfill material, which causes defective filling of the underfill material and voids. Such defective filling and voids decrease the reliability of the bonded parts.

The related arts are disclosed in, e.g., Japanese published unexamined patent application No. 2001-7158, Japanese published unexamined patent application No. 2004-1030 and Japanese published unexamined patent application No. Hei 10-195487 (1998).

SUMMARY OF THE INVENTION

An object of the present invention is to provide a soldering flux which can realize flip-chip bonding of high reliability even when the gap between a semiconductor chip and a circuit board is small, and a method for bonding a semiconductor element with the flux.

According to one aspect of the present invention, there is provided a soldering flux to be used in reflow-bonding a solder bump formed on a first substrate to an electrode formed on a second substrate, comprising: a first thermosetting resin, a polyhydric alcohol and an organic acid, the first thermosetting resin remaining uncured after the reflow-bonding.

According to another aspect of the present invention, there is provided a method for bonding a semiconductor element, which reflow-bonding a solder bump formed on a first substrate to an electrode formed on a second substrate, comprising the steps of: applying a soldering flux to be used in reflow-bonding the solder bump formed on the first substrate to the electrode formed on the second substrate, comprising: a first thermosetting resin, a polyhydric alcohol and an organic acid, the first thermosetting resin remaining uncured after the reflow-bonding, to the solder bump; reflow-bonding the solder bump to the electrode with the soldering flux while melting the solder bumps; and filling an underfill material between the first substrate and the second substrate with the soldering flux being left, the underfill material including a second thermosetting resin of the same group as the first thermosetting resin and at least one of a curing agent and a cure catalyst for curing the first and the second thermosetting resins.

According to the present invention, a solder bump formed on a first substrate is reflow-bonded to an electrode formed on a second substrate with a soldering flux containing a thermosetting resin, a polyhydric alcohol and an organic acid and containing no curing agent nor cure catalyst, and with the soldering flux being left, an underfill material which is compatible with the soldering flux and contains at least one of a curing agent for curing the thermosetting resin of the soldering flux and a cure catalyst for accelerating the cure is filled between the first substrate and the second substrate, whereby even when the gap between the first substrate and the second substrate is small, the flip-chip bonding can have high reliability.

DETAILED DESCRIPTION OF THE INVENTION

One Embodiment

Figure 3A:
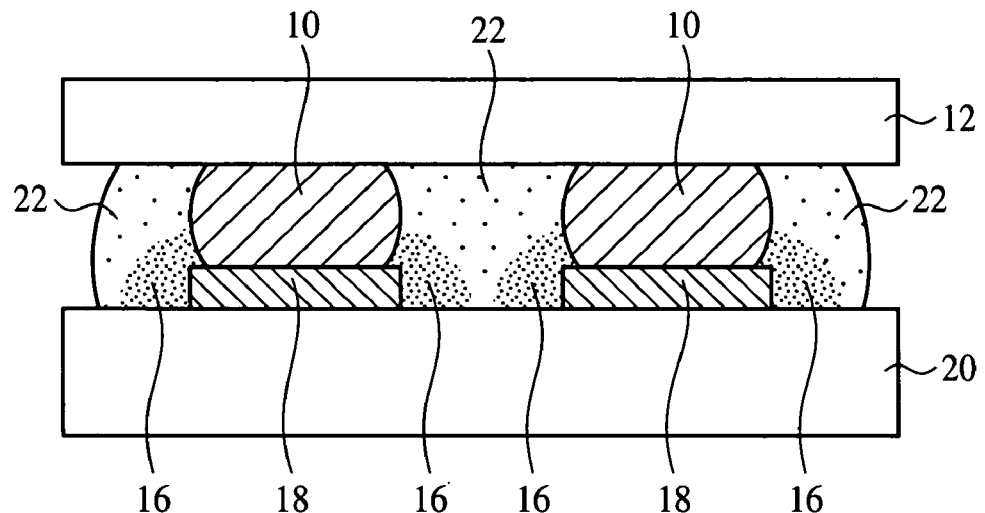
FIGS. 3A and 3B are views explaining a mounted structure fabricated by the method for bonding a semiconductor element according to the embodiment of the present invention.
Figure 3B:
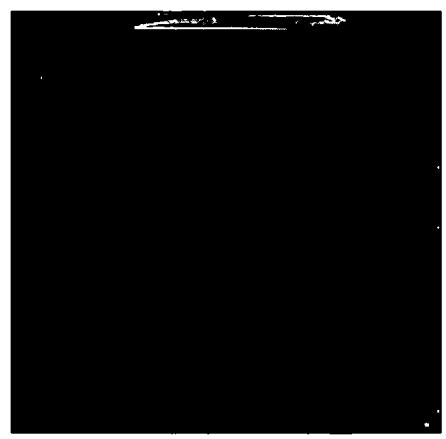
Figure 4A:
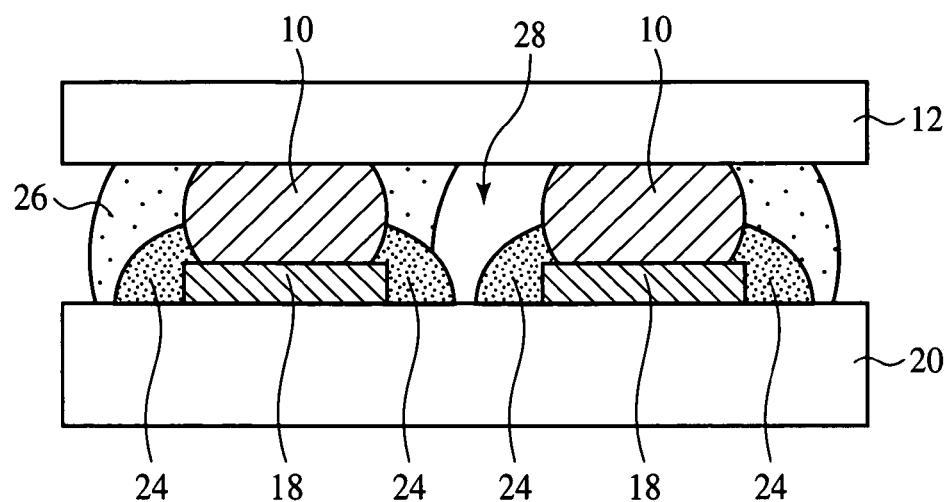
FIGS. 4A and 4B are views explaining a mounted structure fabricated by the method for bonding a semiconductor element using the conventional nonwash-type flux.
Figure 4B:
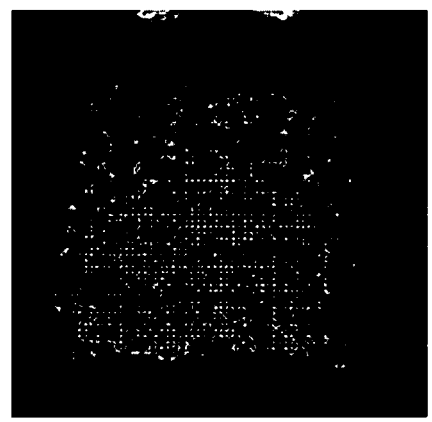
Figure 5A:
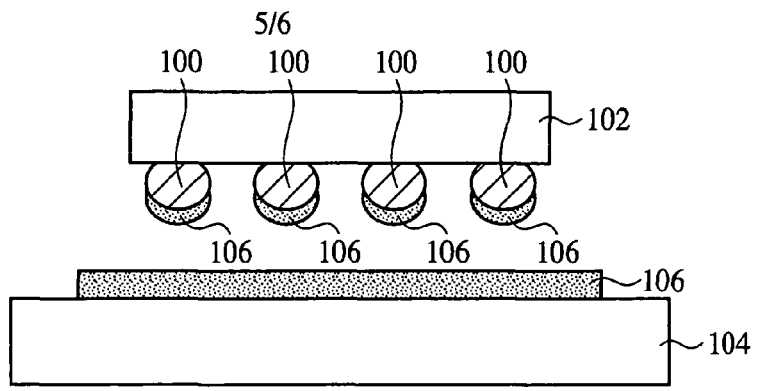
FIGS. 5A-5D and 6A-6C are sectional views of a semiconductor element in the steps of the conventional flip-chip bonding, which illustrate the bonding.
Figure 5B:
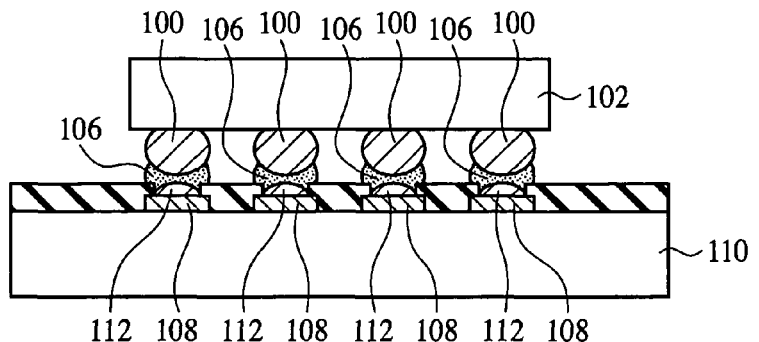
Figure 5C:
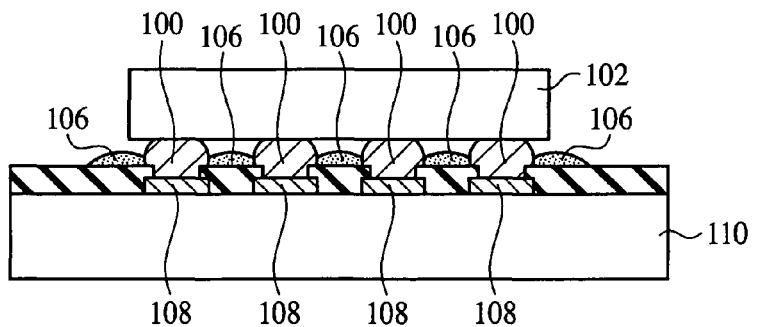
Figure 5D:
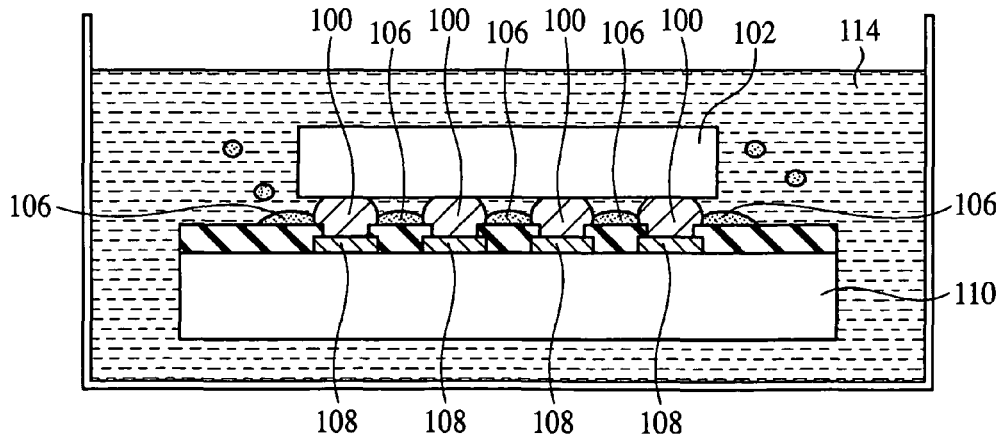
Figure 6A:
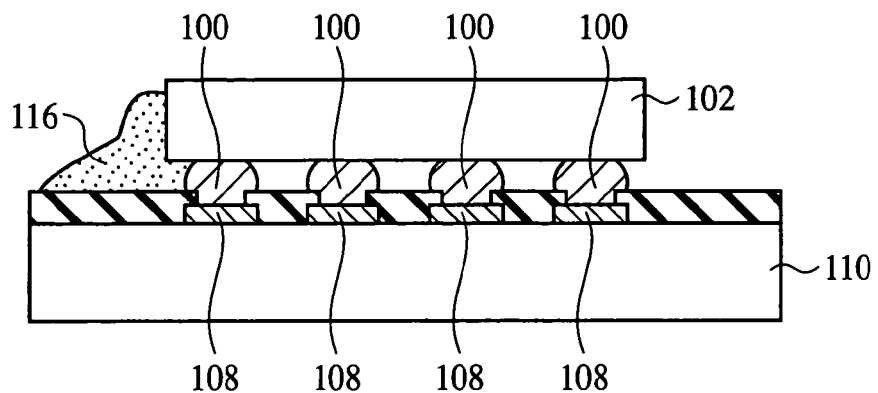
Figure 6B:
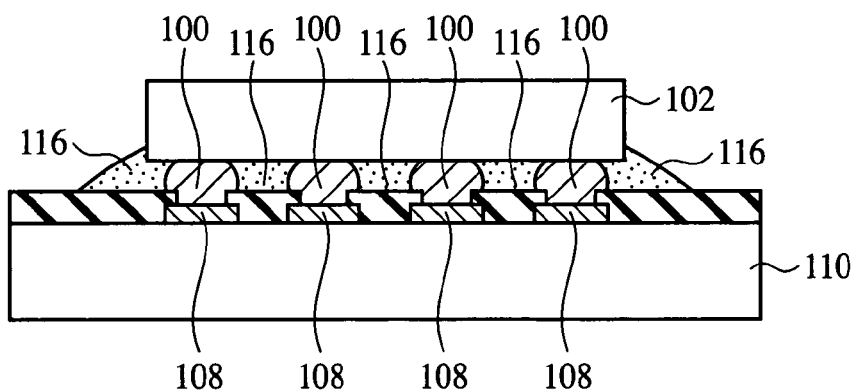
Figure 6C:
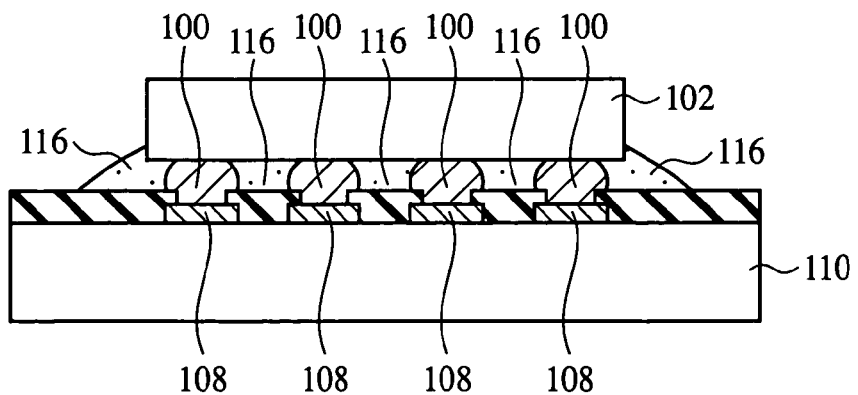

The soldering flux and the method for bonding a semiconductor element according to one embodiment of the present invention will be explained with reference to FIGS. 1A-1C, 2A-2C, 3A-3B and 4A-4B. FIGS. 1A-1C and 2A-2C are sectional views of a semiconductor element in the steps of a method for bonding the same according to the present embodiment, which illustrate the method. FIGS. 3A and 3B are views explaining a mounted structure fabricated by the method for bonding a semiconductor element according to the present embodiment. FIGS. 4A and 4B are views explaining a mounted structure fabricated by the method for bonding a semiconductor element using the conventional nonwash-type flux.

First, the soldering flux according to the present embodiment will be explained.

The soldering flux according to the present embodiment is characterized in that the soldering flux is of the nonwash-type type to be used in the flip-chip bonding, functions as a flux in bonding solder bumps in the flip-chip bonding, and is not singly cured but is cured by a curing agent or a curing catalyst contained in an underfill material to be filled later between a semiconductor chip and a circuit board.

The soldering flux according to the present embodiment contains a thermosetting resin, polyhydric alcohol and an organic acid which have flux activity, and a viscosity modifier. The respective ingredients of the soldering flux according to the present embodiment will be detailed below.

The thermosetting resin contained in the soldering flux is a thermosetting resin of the same group as a thermosetting resin forming the underfill material. Accordingly, the thermosetting resin contained in the soldering flux is sufficiently compatible with the thermosetting resin of the underfill material. Specifically, for example, a cyanate ester-based thermosetting resin such as bisphenol F cyanate ester, bisphenol A cyanate ester, phenol novolak resin cyanate ester or others, is used. The cyanate ester-based thermosetting resin has the property that the resin is not cured at the soldering temperature in the absence of a cure catalyst (cure accelerator) Accordingly, the soldering flux does not contain such cure catalyst.

On the other hand, when the thermosetting resin contained in the soldering flux is epoxy resin, the underfill material contains the curing agent of acid anhydride, amine or others.

The content ratio of the thermosetting resin in the soldering flux is preferably 30-70 wt %. This is because when the content ratio of the thermosetting resin is below 30 wt %, the soldering flux is not cured even after the underfill material has been filled, and the flux activity is hindered when the content ratio is above 70 wt %.

The polyhydric acid is dihydric alcohol of a 100-250 molecular weight or trihydric alcohol of a 100-150 molecular weight and is liquid at the room temperature. Specifically, for example, 1, 2, 3-hexanetriol, 1, 2, 6-hexanetriol, 1, 2, 4-butanetriol, 3-methylpentane-1, 3, 5-tirol, tetraethylene glycol, triethylene glycol, hexaethylene glycol, pentaethylene glycol, glycerol, a glycerol derivative or another is used. Two or more of them may be mixed.

The content ratio of the polyhydric alcohol of the soldering flux is preferably 20-60 wt %. This is because when the content ratio of the polyhydric alcohol is below 20 wt %, flux activity is not exerted, and the soldering flux is not cured even after the underfill material has been filled when the content ratio is above 60 wt %.

The organic acid is, e.g., sebacic acid, succinic acid, glutaric acid, maleic acid, fumaric acid, citraconic acid, itaconic acid, glycolic acid, citric acid, diglycolic acid, benzoic acid, salicylic acid, oxalic acid, malonic acid, glutaric acid, adipic acid, pimelic acid, suberic acid, azelaic acid, tartaric acid or another. Two or more of them may be mixed.

The content ratio of the organic acid of the soldering flux is preferably 2-20 wt %. This is because when the content ratio of the organic acid is below 2 wt %, flux activity is not exerted, and the viscosity of the soldering flux is increased more than required when the content ratio is above 20 wt %.

The flux action of the soldering flux according to the present invention is owing to the polyhydric alcohol and the organic acid described above. Using the polyhydric alcohol and the organic acid together provides the following merit.

The polyhydric alcohol has two or more hydroxyl groups (—OH). The hydroxyl groups of the polyhydric alcohol react with the carboxyl groups (—COOH) of organic acid and form ester linkages. The polyhydric alcohol and the organic acid produce ester compounds to thereby lose flux activity. Thus, corrosion of the solder bumps, the electrodes, etc. after the underfill material and the soldering flux have been cured can be decreased.

Furthermore, the polyhydric alcohol and the organic acid produce ester compounds, whereby the viscosity of the soldering flux is increased when returned to the room temperature after the solder bumps have been bonded. The viscosity of the soldering flux is thus increased, whereby before the underfill material is filled after the soldering bumps have been bonded, sags of the uncured soldering flux can be depressed.

The viscosity modifier is used to ensure the printability of the soldering flux. Specifically, highly viscous cyanate ester resin, rosin diol or another is used. The content ratio of the viscosity modifier of the soldering flux is suitably set in accordance with a viscosity of the soldering flux, e.g., 1-10 wt %.

The soldering flux according to the present embodiment, which contains the above-described ingredients, contains no curing agent nor cure catalyst for the thermosetting resin and does not singly cure. The soldering flux according to the present embodiment is compatibly mixed with the underfill material filled between the semiconductor chip and the circuit board after the solder bumps have been bonded to be cured by the curing agent or the cure catalyst contained in the underfill material.

As described above, the soldering flux according to the present embodiment is not cured upon bonding the solder bumps but is compatibly mixed with the underfill material, whereby the interface between the soldering flux and the underfill material becomes seamless. Thus, the adhesion strength of the underfill material can be increased, and the reliability of the bonded parts can be increased.

The soldering flux according to the present embodiment is uncured when the underfill material is filled and does not hinder the flowability of the underfill material. Accordingly, the defective filling of the underfill material and the generation of voids can be suppressed, and the reliability of the bonded parts can be increased.

Accordingly, even when the solder bumps have, e.g., a diameter of below 100 µm including 100 µm, and the gap between the semiconductor chip and the circuit board is, e.g., below 100 µm including 100 µm, the underfill material can be filled with high adhesion strength while the defective filling and the generation of bonds are suppressed. Furthermore, the wash of the flux is unnecessary, which can shorten the time required for the bonding step.

The underfill material to be used together with the soldering flux according to the present embodiment contains a thermosetting resin of the same group as the thermosetting resin of the soldering flux according to the present embodiment. Furthermore, the underfill material contains at least one of the curing agent and the curing catalyst (cure accelerator) of the thermosetting resin.

The thermosetting resin of the underfill material is, specifically, e.g., bisphenol F cyanate ester, bisphenol A cyanate ester, phenol novolak resin cyanate ester or another.

The curing agent contained in the underfill material cures the epoxy-based resin when the soldering flux and the underfill material both use epoxy-based resin as the thermosetting resins. Specifically, for example, an amine-based curing agent or an acid anhydride-based curing agent is used.

The amine-based curing agent is, e.g., ethylenediamine, diethylenetriamine, triethylenetetramine, tetraethylenepentamine, diaminodiphenylmethane or m-phenylenediamine.

The acid anhydride-based curing agent is, e.g., phthalic anhydride, maleic anhydride, tetrahydrophthalic anhydride, hexahydrophthaic anhydride, himic anhydride, tetrabromophthalic anhydride, trimellitic anhydride or pyromellitic dianhydride.

The cure catalyst contained in the underfill material accelerates the curing reaction of the thermosetting resins of both the soldering flux and the underfill material. Specifically, the cure catalyst is an organo-transition metal complex of cobalt (III), copper(II), manganese(II), zinc(II) or another, e.g., acetylacetonate or octoate of these metals. When the soldering flux and the underfill material are formed of a cyanate ester-based resin as the thermosetting resin, such cure catalyst is contained in the underfill material.

The underfill material contains a filler of silica particles or another.

Next, the method for bonding a semiconductor element according to the present embodiment, which uses the soldering flux described above, will be explained with reference to FIGS. 1A-1C and 2A-2C.

First, a semiconductor chip 12 with solder bump electrodes, i.e., the solder bumps 10 formed on is prepared. The solder bumps 10 have a diameter of, e.g., below 100 µm including 100 µm.

Figure 1A:
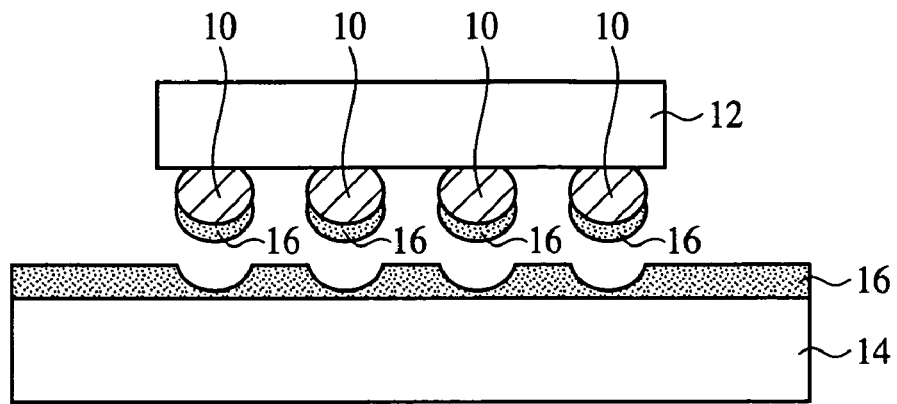
FIGS. 1A-1C and 2A-2C are sectional views of a semiconductor element in the steps of a method for bonding the same according to one embodiment of the present invention, which illustrate the method.

Then, the solder bumps 10 of the semiconductor chips 12 are brought into contact with the soldering flux 16 according to the present embodiment printed in advance on a flat plate 14 with a squeegee to transfer the soldering flux 16 to the solder bumps 10 (FIG. 1A).

Figure 1B:
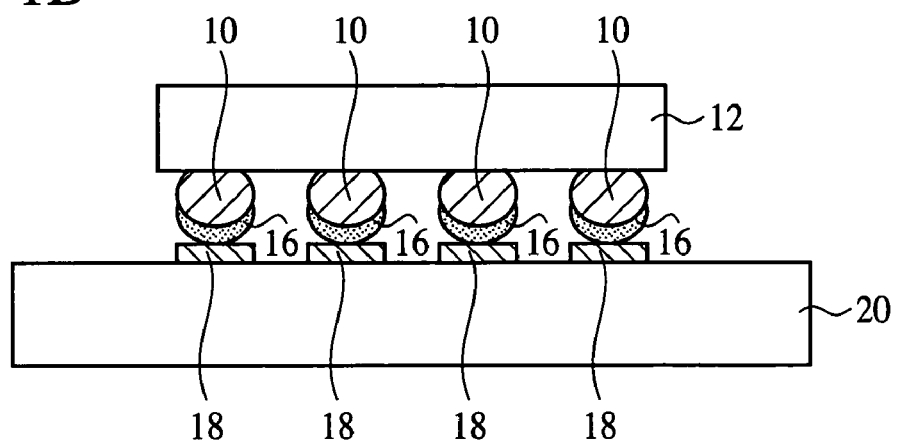

Next, a circuit board 20 with electrodes 18 formed on is prepared, and the solder bumps 10 of the semiconductor chip 12 and the electrodes 18 of the circuit board 20 are aligned with each other (FIG. 1B).

Figure 1C:
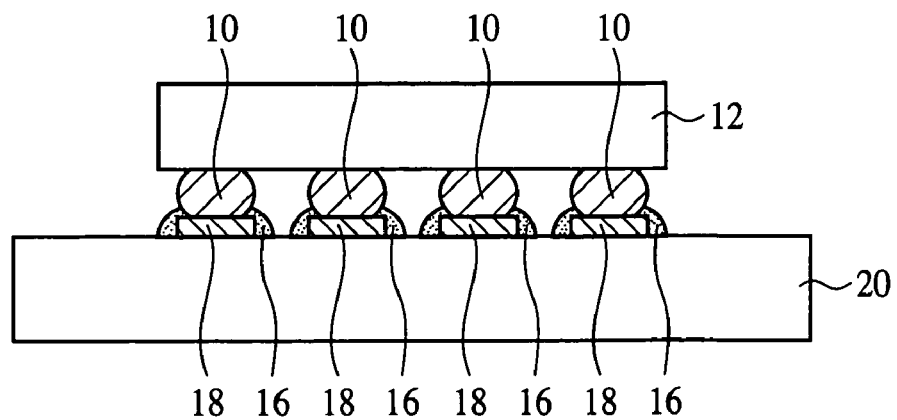

Then, the solder bumps 10 of the semiconductor chip 12 is melted by heating to reflow-bond the solder bumps 10 of the semiconductor chip 12 to the electrodes 18 of the circuit board 20 (FIG. 1C). The soldering flux 16 according to the preset embodiment, which contains no curing agent nor cure catalyst, is not cured after bonding the solder bumps 10. That is, the thermosetting resin contained in the soldering flux 16 remains uncured after the reflow bonding.

The polyhydric alcohol and the organic acid contained in the soldering flux 16 according to the present embodiment produce an ester compound after bonding the soldering bumps 10, and flux activity is lost. Thus, the generation of corrosion of the solder bumps 10, the electrodes 18, etc. after the underfill material 22 and the soldering flux 16 have been cured can be decreased. The polyhydric alcohol and the organic acid produce the ester compound, whereby the viscosity of the soldering flux 16 at the room temperature is increased. Thus, after the solder bumps 10 have been bonded and before the underfill material 22 is filled, sags of the uncured soldering flux 16 can be suppressed.

The thermosetting resin is often a little cured only by heating. The uncured state in the present invention is the state where the thermosetting resin is not cured by the action of the curing agent and the cure catalyst, the state where the thermosetting resin is not perfectly cured.

Figure 2A:
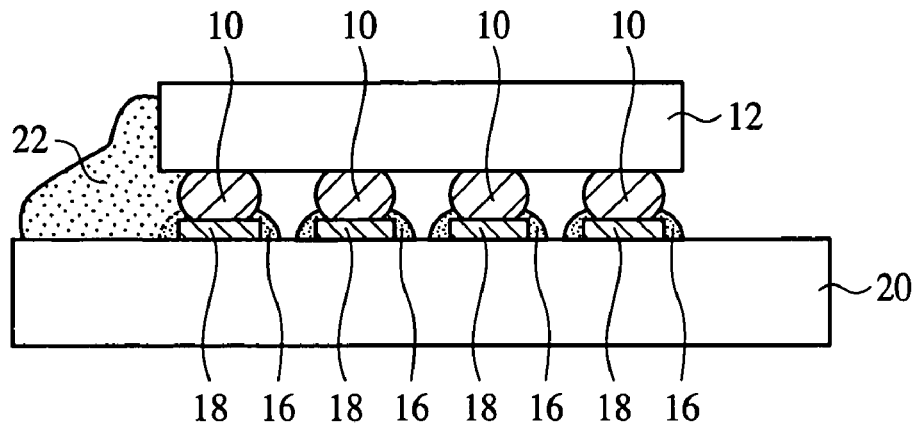
Figure 2B:
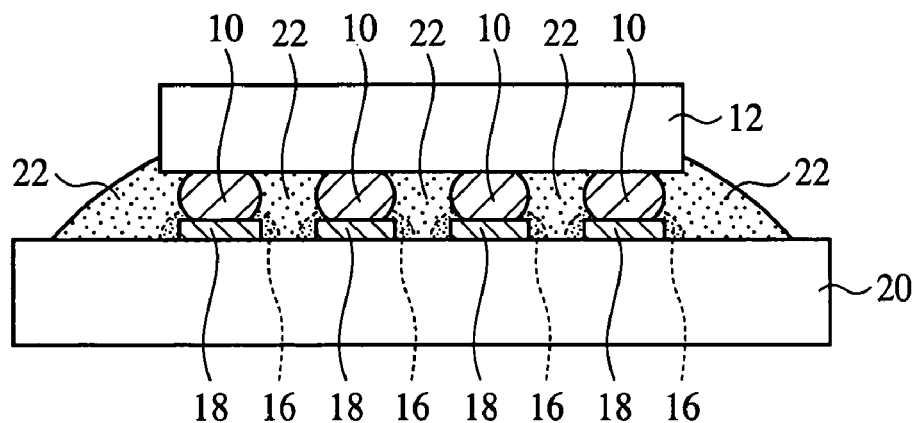

Next, the underfill material 22 is filled between the semiconductor chip 12 and the circuit board 20 (FIG. 2A, FIG. 2B). As described above, the underfill material 22 contains a thermosetting resin of the same group as the thermosetting resin of the soldering flux 16 and at least one of the curing agent and the cure catalyst for the thermosetting resin.

When the underfill material 22 is filled, the soldering flux 16 according to the present embodiment is uncured and compatibly mixed with the underfill material 22. Accordingly, the interface between the soldering flux 16 and the underfill material 22 is seamless. Thus, the adhesion strength of the underfill material 22 can be increased, and the reliability of the bonded parts can be increased.

The soldering flux 16 according to the present embodiment, which is uncured, does not hinder the flow of the underfill material 22. Accordingly, the filling defect of the underfill material 22 and the generation of voids can be suppressed, and the reliability of the bonded parts can be increased.

Thus, even when the solder bumps 10 has a diameter of, e.g., below 100 μm including 100 μm, and the gap between the semiconductor chip 12 and the circuit board 20 is, e.g., below 150 μm including 150 μm, the underfill material 22 can be filled with high adhesion strength while the filling defect and the generation of voids being suppressed. Furthermore, the wash of the flux is unnecessary, which can shorten the time required for the bonding step.

Figure 2C:
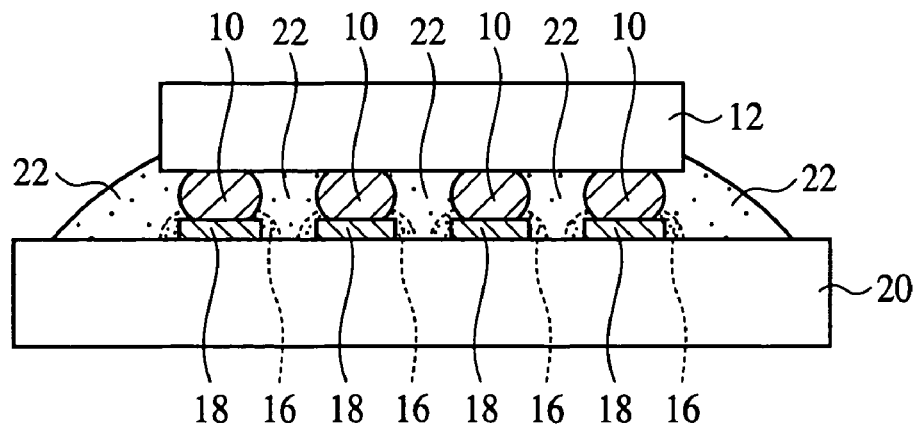

Then, the underfill material 22 filled between the semiconductor chip 12 and the circuit board 20 is cured by heating (FIG. 2C). At this time, the soldering flux 16 compatibly mixed with the underfill material 22 is also cured by the curing agent or the cure catalyst contained in the underfill material 22. The underfill material 22 decreases the thermal expansion strain between the semiconductor chip 12 and the circuit board 20, and the corrosion of the solder bumps 10, the electrodes 18, etc. due to the intrusion of water can be prevented.

Thus, the semiconductor chip 12 and the circuit board 20 are flip-chip bonded.

FIG. 3A is a diagrammatic sectional view of a mounted structure fabricated by the method for bonding a semiconductor element according to the present embodiment, and FIG. 3B is an image of the mounted structure fabricated by the method for bonding a semiconductor element according to the present embodiment, which was taken by a supersonic flaw detector. FIG. 4A is a diagrammatic sectional view of a mounted structure fabricated by the method for bonding a semiconductor element with the conventional nonwash-type flux, in which the flux is cured after the solder bumps are bonded and before the underfill material is filled. FIG. 4B is an image of the mounted structure fabricated by the method for bonding a semiconductor element with the conventional nonwash-type flux, which was taken by the supersonic flaw detector. The images of FIGS. 3B and 4B taken by the supersonic flaw detector were taken of the mounted structures having 13 mm-square semiconductor chips mounted on circuit boards at the side of the semiconductor chips.

In the present embodiment, when the underfill material 22 is filled, the soldering flux 16 is uncured. At this time, the soldering flux 16 is compatibly mixed with the underfill material 22, and does not hinder the flow of the underfill material 22. Accordingly, as illustrated in FIG. 3A, even after the underfill material 22 has been cured, the interface between the soldering flux 16 and the underfill material 22 is seamless, and the adhesion strength of the underfill material 22 can be increased. The generation of voids in the underfill material 22 can be sufficiently suppressed. The image of FIG. 3B taken by the supersonic flaw detector shows that no voids have been formed.

In contrast to this, in the case using the conventional non-wash-type flux, which is cured after the solder bumps have been bonded and before the underfill material is filled, as illustrated in FIG. 4A, the cured flux 24 forms an interface with respect to the underfill material 26 to be filled later. Accordingly, the adhesion strength of the underfill material 26 is decreased, and the reliability of the bonded parts is decreased. Furthermore, the cured flux 24 hinders the flow of the underfill material 26 when the underfill material 26 is filled. Resultantly, voids 28 which are to be a cause for decreasing the reliability are generated in the underfill material 26. The image of FIG. 4B take by the supersonic flaw detector shows that a number of voids have been formed.

As described above, according to the present embodiment, the soldering flux which, upon bonding the solder bumps in flip-chip bonding, functions as a flux and does not singly cure because of no curing agent nor cure catalyst contained therein, and is cured by the curing agent or the cure catalyst contained in the underfill material filled between the semiconductor chip and the circuit board is used, whereby even when the gap between the semiconductor chip and the circuit board is small, the flip-chip bonding can be highly reliable.

EXAMPLES 1 TO 3

First, the nonwash-type fluxes of the compositions shown in Table 1 were prepared. The compositions shown in Table 1 are indicated by wt %.

TABLE 1

|  | Ingredient | Example 1 | Example 2 | Example 3 |
|---|---|---|---|---|
| Thermosetting resin | Cyanate ester (L-10) | 30 | 30 | 30 |
| Activator | Hexanetriol (liquid) | 50 | 50 | 50 |
|  | Sebacic acid (solid) | 2 | 5 | 10 |
| Viscosity modifier | High viscosity cyanate ester (PT30) | 2 | 2 | 0 |
|  | Rosin diol | 2 | 2 | 0 |

The fluxes were prepared as follows.

First, hexanetriol and sebacic acid were mixed. The liquid activator is mixed at the room temperature, but the solid activator is mixed, being suitably heated at below 100° C. including 100° C.

Then, the mixed hexanetriol and sebacic acid were mixed with cyanate ester.

Next, to ensure the printability of the fluxes, the viscosity modifier was suitably added.

Then, the flip-chip bonding was conducted with the prepared fluxes. The semiconductor chip had a 10 mm-square size and had solder bumps of SnAgCu and a 100 μm-diameter formed at a 200 μm-pitch. The circuit board was a resin substrate. The semiconductor chip and the circuit board had a daisy chain so that the resistance could be measured after the flip-chip bonding.

The flip-chip bonding was conducted as follows.

First, the solder bumps of the semiconductor are brought into contact with the nonwash-type flux printed in advance on a flat plate with a squeegee to transfer the flux.

Next, the solder bumps of the semiconductor chip and the electrodes of the circuit board are aligned with each other and are heated at a 250° C. peak temperature in a nitrogen atmosphere to melt the solder bumps of the semiconductor chip and reflow-bond the solder bumps of the semiconductor chip to the electrodes of the circuit board. The gap between the semiconductor chip and the circuit board after bonded was about 70 μm.

Then, the cyanate ester-based underfill material was filled between the semiconductor chip and the circuit board.

Then, heating of 165° C. was made for 1.5 hours to thereby cure the underfill material filled between the semiconductor chip and the circuit board.

A heat cycle test of −55° C. to 125° C. was made on the respective samples flip-chip bonded with the nonwash-type fluxes to evaluate the reliability of the bonded parts. The heat cycle test was made also on the sample as Control 1 in which flip-chip bonding was conducted with the commercial rosin-based flux which requires the wash of the residue after the bonding and the sample as Control 2 in which flip-chip bonding was conducted with the commercial nonwash-type flux which cures after the solder bumps have been bonded and before the underfill material is filled to evaluate the reliability of the bonded parts.

Examples 1 to 3, which used the nonwash-type fluxes, had no defect even after 1000 cycles.

In contrast to this, Control 1, in which the commercial rosin-based flux was used, had defect after 850 cycles. Control 2, in which the commercial nonwash-type flux was used, had defect after 600 cycles.

As described above, the use of the nonwash-type fluxes of Examples 1 to 3 provided high reliability of the bonded parts in comparison with not only the use of the commercial nonwash-type flux which cures after the solder bumps have been bonded and before the underfill material is filled but also the use of the commercial rosin-based flux.

Modified Embodiments

The present invention is not limited to the above-described embodiment and can cover other various modifications.

For example, in the above-described embodiment, the solder bump electrodes are formed on a semiconductor chip. However, solder bumps may be additionally formed on electrodes formed on the semiconductor chip.

In the above-described embodiment, the solder bumps are formed on the side of the semiconductor chip. However, the solder bumps may be formed on the side of the semiconductor chip and also on the side of the circuit board.

In the above-described embodiment, the soldering flux is applied to the solder bumps of the semiconductor chip. However, the soldering flux may be applied to the electrodes or solder bumps of the circuit board.

In the above-described embodiment, the activator for activating the flux is polyhydric alcohol and organic acid. However, either of them may be used.

What is claimed is:

1. A method for bonding a semiconductor element, which includes reflow-bonding a solder bump formed on a first substrate to an electrode formed on a second substrate, comprising:

applying a soldering flux to be used in reflow-bonding the solder bump formed on the first substrate to the electrode formed on the second substrate, comprising: a first thermosetting resin, a polyhydric alcohol and an organic acid, the soldering flux not including a curing agent or a cure catalyst;

reflow-bonding the solder bump to the electrode with the soldering flux which is not cured while melting the solder bumps without curing the first thermosetting resin thereby keeping the soldering flux uncured;

filling an underfill material between the first substrate and the second substrate with the soldering flux which is not cured being left, the underfill material including a second thermosetting resin of the same group as the first thermosetting resin and at least one of a curing agent and a cure catalyst for curing the first and the second thermosetting resins; and after filling an underfill material to compatibly mix the first and the second thermosetting resins, heating to cure the first and the second thermosetting resins compatibly mixed with each other.

2. A method for bonding a semiconductor element according to claim 1, wherein the second thermosetting resin is bisphenol F cyanate ester, bisphenol A cyanate ester, or phenol novolak resin cyanate ester.

3. A method for bonding a semiconductor element according to claim 1, wherein the underfill material contains the cure catalyst when the first and the second thermosetting resins are cyanate ester-based resins.

4. A method for bonding a semiconductor element according to claim 1, wherein the underfill material contains the curing agent when the first and the second thermosetting resins are epoxy-based resins.

* * * * *